US010673375B2

(12) United States Patent
Bashford et al.

(10) Patent No.: US 10,673,375 B2
(45) Date of Patent: Jun. 2, 2020

(54) POWER-OVER-FIBER RECEIVER

(71) Applicant: LASERMOTIVE, INC., Kent, WA (US)

(72) Inventors: Thomas W. Bashford, Seattle, WA (US); Thomas J. Nugent, Jr., Bellevue, WA (US); David Bashford, Kent, WA (US)

(73) Assignee: LASERMOTIVE, INC., Kent, WA (US)

( * ) Notice: Subject to any disclaimer, the term of this patent is extended or adjusted under 35 U.S.C. 154(b) by 0 days.

(21) Appl. No.: 16/033,082

(22) Filed: Jul. 11, 2018

(65) Prior Publication Data

US 2019/0020304 A1    Jan. 17, 2019

Related U.S. Application Data

(60) Provisional application No. 62/531,821, filed on Jul. 12, 2017.

(51) Int. Cl.
| | |
|---|---|
| *H02S 30/10* | (2014.01) |
| *H01L 31/05* | (2014.01) |
| *H02S 40/20* | (2014.01) |
| *H01L 31/054* | (2014.01) |
| *G02B 27/30* | (2006.01) |
| *G02B 27/09* | (2006.01) |
| *H02S 40/22* | (2014.01) |
| *H01L 31/042* | (2014.01) |
| *H01L 31/052* | (2014.01) |

(52) U.S. Cl.
CPC .......... *H02S 30/10* (2014.12); *G02B 27/0994* (2013.01); *G02B 27/30* (2013.01); *H01L 31/042* (2013.01); *H01L 31/05* (2013.01); *H01L 31/052* (2013.01); *H01L 31/054* (2014.12); *H01L 31/0547* (2014.12); *H02S 40/20* (2014.12); *H02S 40/22* (2014.12)

(58) Field of Classification Search
CPC ....... H02S 30/10; H02S 40/20; H01L 31/054; H01L 31/05; G02B 27/0994; G02B 27/30
See application file for complete search history.

(56) References Cited

U.S. PATENT DOCUMENTS

| | | | |
|---|---|---|---|
| 4,040,867 | A | 8/1977 | Forestieri et al. |
| 7,813,646 | B2 | 10/2010 | Furey |
| 9,090,315 | B1 | 7/2015 | Stone et al. |
| 9,800,091 | B2 | 10/2017 | Nugent, Jr. et al. |
| 9,838,143 | B2 | 12/2017 | Chan et al. |
| 9,912,379 | B2 | 3/2018 | Hyde et al. |

(Continued)

OTHER PUBLICATIONS

U.S. Appl. No. 16/033,120, filed Jul. 11, 2018, Power-Over-Fiber Safety System.

*Primary Examiner* — Jayne L Mershon
(74) *Attorney, Agent, or Firm* — Seed IP Law Group LLP

(57) ABSTRACT

An electromagnetic energy receiving device includes an energy conversion component and an opto-mechanical coupling. The opto-mechanical coupling is arranged to receive a fiber-based conduit. The energy conversion component includes at least one internal surface having an arced profile of radius R, and the internal surface has a plurality of photovoltaic (PV) assemblies arranged thereon such that each one of the plurality of PV assemblies is shingled upon at least one adjacent PV assembly.

20 Claims, 6 Drawing Sheets

(56) References Cited

U.S. PATENT DOCUMENTS

| | | | |
|---|---|---|---|
| 2014/0318620 A1* | 10/2014 | Kare | H01L 31/0547 |
| | | | 136/259 |
| 2015/0380588 A1* | 12/2015 | Lasich | H01L 27/1421 |
| | | | 136/244 |
| 2017/0151755 A1* | 6/2017 | Koba | B32B 7/12 |

* cited by examiner

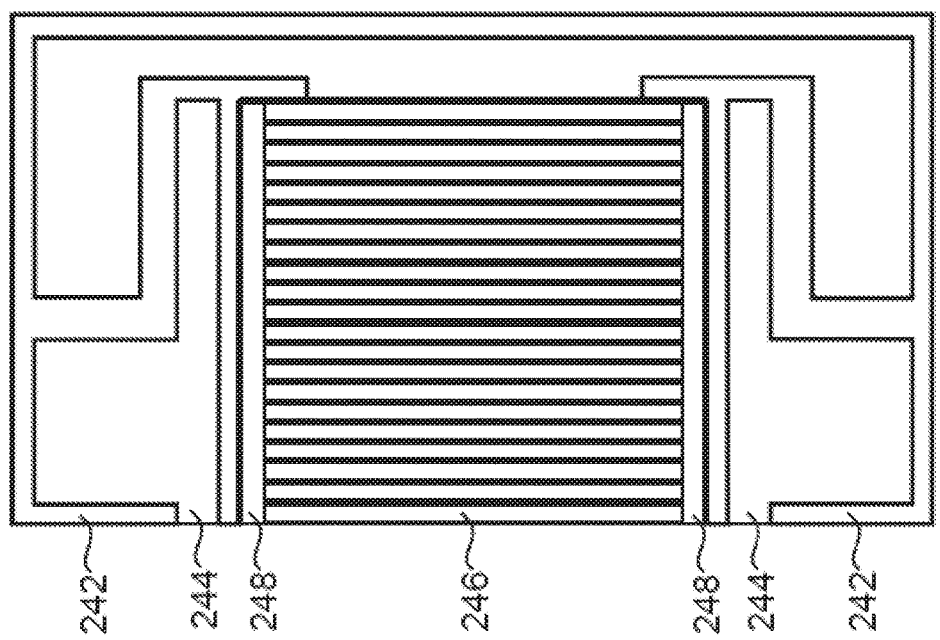
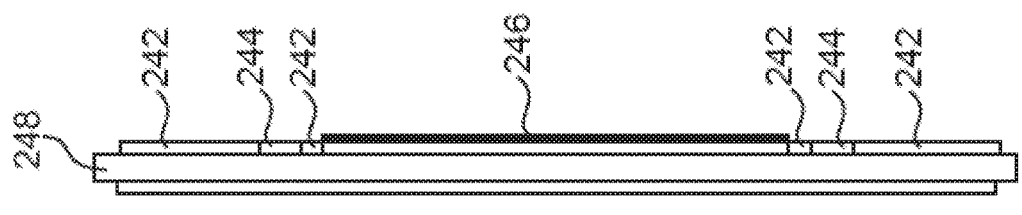
Fig. 5B Front View
Fig. 5A Side View

POWER-OVER-FIBER RECEIVER

BACKGROUND

Technical Field

The present disclosure generally relates to a receiver device in a system that passes power over a fiber-based medium. More particularly, but not exclusively, the present disclosure relates to a power-over-fiber (PoF) receiver having a plurality of light-receiving elements arranged in a shingled conformation.

Description of the Related Art

Some aspects of technologies and related art that may be useful in understanding the present invention are described in U.S. Patent Application Publication No. U.S. 2014/0318620 A1, which is also U.S. patent application Ser. No. 14/263,858, to Kare et al., which describes a device for converting electromagnetic radiation into electricity, and related systems and methods. The Kare publication is incorporated herein by reference.

In the Kare publication, a device for converting electromagnetic radiation into electricity comprises an expander that includes a conical shape having an axis and a curved surface that is configured to reflect electromagnetic radiation away from the axis to expand a beam of the electromagnetic radiation. The device also comprises one or more energy conversion components. The energy conversion components are configured to receive electromagnetic radiation expanded by the expander and further configured to produce electricity from the expanded beam of electromagnetic radiation. With the expander's curved surface, beamed electromagnetic radiation that is highly concentrated, and which has a large radiation flux, is converted into beamed electromagnetic radiation that has a larger cross-sectional area. Moreover, in some embodiments, the curved surface is configured to provide a substantially uniform distribution of radiation across the expanded cross-sectional area. With such an expanded beam, the one or more energy conversion components can more efficiently convert at least some of the electromagnetic radiation into electricity.

Some other aspects of technologies and related art that may be useful in understanding the present invention are described in U.S. patent application Ser. No. 14/124,993, which is now U.S. Pat. No. 9,800,091 to Nugent et al., and which describes an aerial platform system and related method. The Nugent publication is incorporated herein by reference.

In the Nugent publication, an aerial platform receives power in the form of light, for example laser light, transmitted via an optical fiber from a remote optical power source. The platform comprises a receiver which converts at least a portion of the light to a different form of power, for example electric power. The platform also comprises a propulsion element which consumes the different form of power to generate propulsive thrust. Supplying power to the aerial platform from a remote source enables the platform to remain aloft longer than a battery or fuel tank carried by the platform would allow. Transmitting the power in the form of light is preferable in many cases to transmitting electric power because electrical conductors are generally heavier than optical fibers and because electrical conductors are hazardous in the presence of lightning, high-voltage power lines, or other hazards.

In a different type of art related to the solar energy technology field, U.S. Pat. No. 4,040,867 to Forestieri, which is also U.S. Pat. No. 717,319, arrays of solar cells are integrated in roof shingles. The solar cells in the Forestieri patent are arranged adjacent to each other on the planar surface of a shingle substrate, and the integrated structures are aligned on a roof surface in a "shingle" tiling pattern such that the back side of one shingle slightly overlaps the front of a next shingle. In the Forestieri patent, the interconnected solar cells are connected to connectors at the edge of the substrate through a connection to a common electrical bus. In other known cases, where the back side of one cell overlaps the front face of the next cell, a direct electrical connection is made without the need for interconnect tabs or wiring.

All of the subject matter discussed in the Background section is not necessarily prior art and should not be assumed to be prior art merely as a result of its discussion in the Background section. Along these lines, any recognition of problems in the prior art discussed in the Background section or associated with such subject matter should not be treated as prior art unless expressly stated to be prior art. Instead, the discussion of any subject matter in the Background section should be treated as part of the inventor's approach to the particular problem, which in and of itself may also be inventive.

BRIEF SUMMARY

The use of conventional photovoltaic (PV) cell assembly is not as efficient as it could otherwise be. In conventional PV cell assembly, individual PV cells are arranged edge-to-edge. Each PV cell has a portion of photovoltaic (PV) material surrounded by a portion of non-PV material. In embodiments of improved PV cell assemblies described herein, adjacent PV cell assemblies are shingled in an enclosed, shaped housing such that at least some part of the non-PV material is covered, and an increased amount of PV material is exposed to the high flux light (e.g., laser light) that is directed into the enclosed, shaped housing.

In a first embodiment, an electromagnetic energy receiving device includes an energy conversion component and an opto-mechanical coupling. The opto-mechanical coupling is arranged to receive a fiber-based conduit. The energy conversion component includes at least one internal surface having an arced profile of radius R, and the internal surface has a plurality of photovoltaic (PV) assemblies arranged thereon such that each one of the plurality of PV assemblies is shingled upon at least one adjacent PV assembly. In some embodiments, the arced internal surface of the energy conversion component has a smooth (i.e., circular, semicircular, elliptical, or the like) profile. In other embodiments, the arced internal surface has a segmented (e.g., polygonal) surface.

An electromagnetic energy receiving device may be summarized as including: an energy conversion component; and an opto-mechanical coupling arranged to receive a fiber-based conduit, wherein the energy conversion component includes at least one internal surface having an arced profile of radius R, the internal surface having a plurality of photovoltaic (PV) assemblies arranged thereon such that each one of the plurality of PV assemblies is shingled upon at least one adjacent PV assembly.

A first distance from an origin point of radius R to a first edge of a first PV assembly may be longer than a second distance from the origin point of radius R to a second edge of the first PV assembly, wherein a third distance between the first edge of the first PV assembly and the second edge of the first PV assembly may represent a width of photovoltaic material of the first PV assembly. The fiber-based conduit may be arranged to pass laser light. The electromagnetic energy receiving device may include: an optical element arranged to receive the laser light and radiate portions of the laser light toward the plurality of PV assemblies. Shingling the plurality of PV assemblies may expose more photovoltaic material to the radiated laser light than if the plurality of PV assemblies were arranged edge-to-edge. The plurality of PV assemblies may form a full circular perimeter around a central axis about which the radius R is measured. The plurality of PV assemblies may form only a partial circular perimeter around a central axis about which the radius R is measured. An area of each one of the plurality of PV assemblies may be less than two square centimeters. An area behind the plurality of PV assemblies may be arranged to pass one or more electrical coupling conduits.

A power-over-fiber (PoF) receiver may be summarized as including: a plurality of light-receiving elements arranged in a substantially cylindrical shingled conformation about a central axis, each of the plurality of light-receiving elements arranged to convert light to electricity.

The PoF receiver may include: an input port to receive light; and an optical element positioned along the central axis, the optical element arranged to expand the light outward toward the shingled conformation of light-receiving elements. The plurality of light-receiving elements may include more than 11 light-receiving elements. The plurality of light-receiving elements may include less than 128 light-receiving elements. The PoF receiver may include: at least one heat-dissipating component thermally coupled to at least one of the plurality of light-receiving elements. Various ones of the plurality of light-receiving elements may be formed on a patterned direct bond copper (DBC) substrate and electrically coupled to an adjacent light-receiving element, respectively, via one or more patterns formed on the DBC substrate.

A method of forming an energy conversion component may be summarized as including: providing a plurality of separate and distinct light-receiving elements, each of the plurality of light-receiving elements arranged to convert light to electricity; providing a receiver support structure having a non-planar surface; and shingly mounting each light-receiving element of the plurality of separate and distinct light-receiving elements such that each light-receiving element: is shingled upon at least one adjacent light-receiving element, has at least one adjacent light-receiving element shingled thereon, or both is shingled upon at least one adjacent light-receiving element and has at least one adjacent light-receiving element shingled thereon.

The method of forming an energy conversion component may include: applying of an adhesive thermal interface material during the mounting. Each of the plurality of light-receiving elements may be mounted on a separate direct bond copper (DBC) substrate. Shingly mounting each light-receiving element may include mounting the light-receiving elements in a full circular pattern about a central axis. The method of forming an energy conversion component may include electrically coupling each light-receiving element to an electrical bus.

This Brief Summary has been provided to introduce certain concepts in a simplified form that are further described in detail below in the Detailed Description. Except where otherwise expressly stated, the Brief Summary does not identify key or essential features of the claimed subject matter, nor is it intended to limit the scope of the claimed subject matter.

BRIEF DESCRIPTION OF THE SEVERAL VIEWS OF THE DRAWINGS

Non-limiting and non-exhaustive embodiments are described with reference to the following drawings, wherein like labels refer to like parts throughout the various views unless otherwise specified. The sizes and relative positions of elements in the drawings are not necessarily drawn to scale. For example, the shapes of various elements are selected, enlarged, and positioned to improve drawing legibility. The particular shapes of the elements as drawn have been selected for ease of recognition in the drawings. One or more embodiments are described hereinafter with reference to the accompanying drawings in which:

FIG. 2 includes FIGS. 2A and 2B;

FIG. 5 shows front and side views of a PV cell assembly.

DETAILED DESCRIPTION

Figure 1:
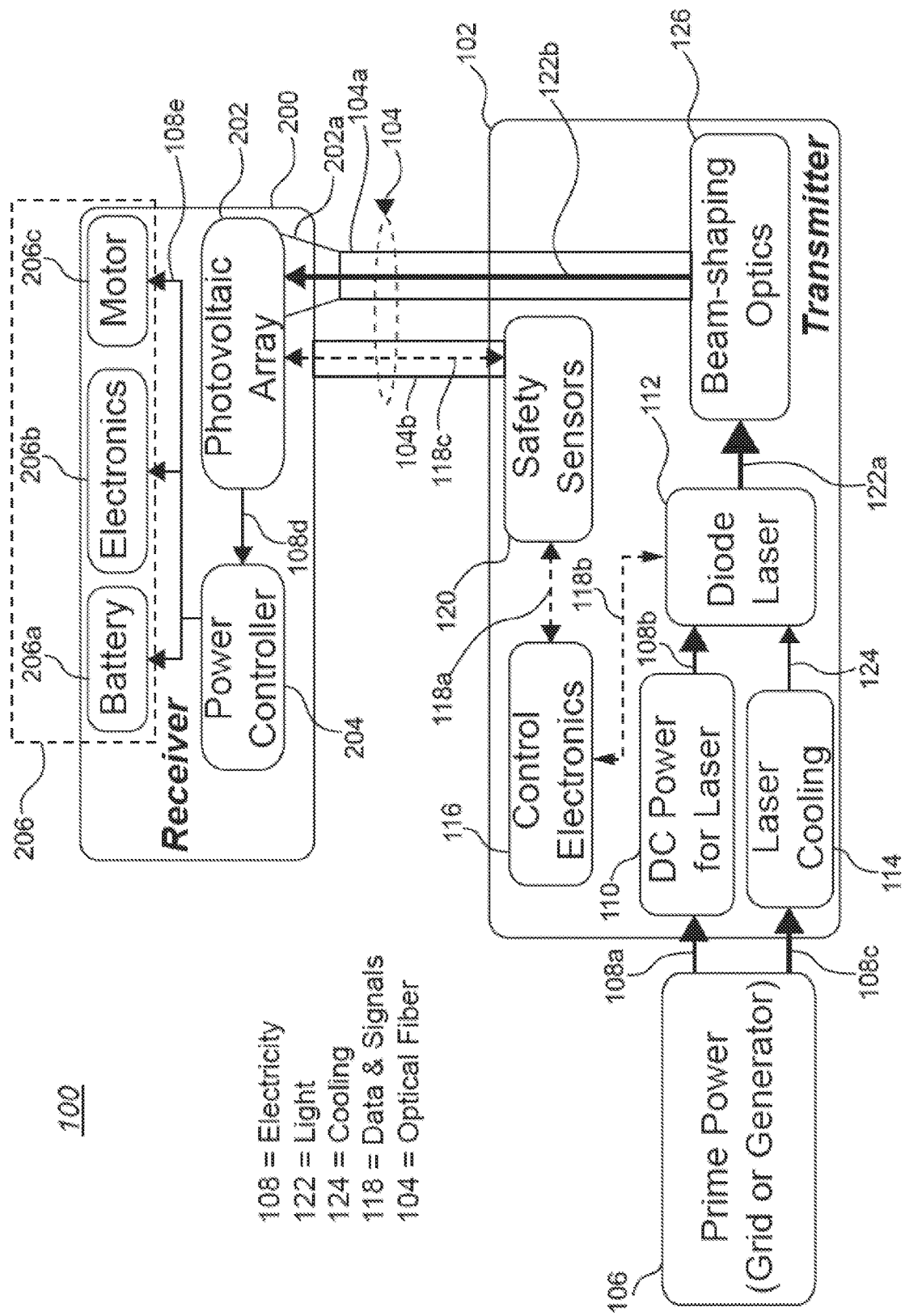
FIG. 1 is a schematic diagram of one embodiment of a power-over-fiber (PoF) system.

Power-over-fiber (PoF) systems generally include a high-flux electromagnetic energy transmitter (e.g., a laser light source) and an electromagnetic energy receiver coupled together by a fiber-based conduit (e.g., a fiber optic cable). Light from the high-flux electromagnetic energy transmitter passes through the fiber-based conduit to the electromagnetic energy receiver, and the electromagnetic energy receiver converts the received light into electricity. In many cases, a laser-based system in the electromagnetic energy transmitter generates the high-flux electromagnetic radiation (e.g., energy, light), and a photovoltaic array in the electromagnetic energy receiver converts the received light into electricity.

It has been recognized by the inventor that in particular circumstances of remote power delivery, improvements may be achieved when energy conversion components, such as photovoltaic cells, are arranged in one type of shingled pattern or another. By overlapping certain portions of the energy conversion component structures, electromagnetic radiation may be received and used more efficiently. In one embodiment, for example, the energy conversion components are arranged within an enclosed receiver in a round, shingled pattern as a cylindrical array of photovoltaic cells. In such an embodiment, the term "round," is used to imply a substantially circular cross-section.

In some device embodiments disclosed in the earlier described Kare publication (i.e., U.S. Patent Application Publication No. U.S. 2014/0318620 A1, which is also U.S. patent application Ser. No. 14/263,858), energy conversion components (e.g., photovoltaic (PV) cells) are arranged on "interior" walls of a round or polygonal cylindrical housing. In this arrangement, electromagnetic radiation (e.g., laser light) directed radially outward from the expander or other such optical element is captured by the energy conversion components. One limitation of at least some systems disclosed in the Kare publication is that spacing between adjacent energy conversion components appropriately arranged on the non-planar interior surfaces (i.e., "walls") may be larger than spacing between adjacent energy conversion components appropriately arranged on a planar surface, due to the spacing needed when the components are arranged at angles relative to each other. When energy conversion components are arranged on the non-planar surface, as in the Kare publication, gaps between adjacent components present a surface area that is reached by the radiated electromagnetic energy, but not used to produce electricity. In this way, at least some power production capacity is lost, thereby reducing efficiency of the receiver. As one example, adjacent energy conversion components might be arranged with one half millimeter (0.5 mm) spacing therebetween. If the energy conversion components are one centimeter (1 cm) wide, then about five percent (~5%) (e.g., 0.5 mm/1 cm=0.05) of power production capacity is not realized.

FIG. 1 is a schematic diagram of one embodiment of a power-over-fiber (PoF) system 100. In the PoF system 100, an electromagnetic energy transmitter 102 produces and passes electromagnetic energy to an electromagnetic energy receiver 200 via one or more fiber-based conduits 104. The fiber-based conduit may be a light conductive structure, a light carrying medium, or some other light transfer means.

The electromagnetic energy transmitter 102 may receive power from an external or internal power source 106. The external or internal power source 106 may draw, generate, or otherwise supply power to the electromagnetic energy transmitter 102 from a central power authority grid, a generator, or some other system.

Within the PoF system 100, electricity 108 having a variety of properties is passed. The variety of properties may include any one or more of voltage, current, frequency, phase, persistence, transience, magnetic characteristics, and the like. Generally in FIG. 1, electricity signals 108 are illustratively sized in accordance to their relative electric potential, but such illustration is non-limiting. Instead, the different relative sizes are provided as but one example to a practitioner of ordinary skill. In FIG. 1, electricity 108a represents electricity from an external or internal power source 106 to an electromagnetic energy transmitter 102, electricity 108b represents electricity from an internal power supply 110 to a laser source 112, electricity 108c represents electricity from an external or internal power source 106 to a laser cooling module 114, electricity 108d represents electricity from an energy conversion component 202 to a power control module 204, and electricity 108e represents electricity from a power control module 204 to one or more electricity consuming devices 206.

In the embodiment of FIG. 1, the laser source 112 is a diode laser source. Other laser source devices are contemplated. For example, the laser source 112 may be a fiber laser doped with any suitable element, a gas-based laser, a solid state-based laser or any other type of laser.

In FIG. 1, the electricity consuming devices 206 optionally include a battery 206a, an electronic circuit 206b, and a motor 206c. In these or other embodiments, the electricity consuming devices 206 may, of course, include any other types of electricity consuming devices including, but not limited to, light producing devices, computing devices, communication devices, telecommunication devices, mechanical devices, electromechanical devices, airborne devices, waterborne devices, stationary devices, mobile devices, industrial devices, consumer devices, and a wide range of other devices that operate using electricity or otherwise benefit from the use of electricity.

An electronics control module 116 associated with the electromagnetic transmitter 102 directs operations of the electromagnetic transmitter 102 via a plurality of control and data signals 118. Control and data signals 118a represent control and data signals passed between the electronics control module 116 and a safety sensors module 120. Control and data signals 118b represent control and data signals between the electronics control module 116 and the diode laser source 112. And control and data signals 118c represent control and data signals between the safety sensors module 120 and the electromagnetic energy receiver 200.

At the command and direction of the electronics control module 116, the diode laser source 112 produces collimated laser light 122a having any desired properties (e.g., wavelength (i.e., monochromaticity), divergence, coherence, flux, etc.). The diode laser source 112 may be cooled by the laser cooling module 114 that deploys any particular cooling technology and its associated cooling medium 124. In some cases, the cooling technology is a water-based cooling technology, and the cooling medium 124 is water.

The collimated laser light 122a is received and acted on by a beam-shaping optics module 126. The beam-shaping optics module 126 forms the electromagnetic energy of the electromagnetic energy transmitter 102 into a laser light having any selected properties 122b. The laser light 122b is passed through a first (primary) fiber-based conduit 104a to the electromagnetic energy receiver 200. Optionally, control and data signals 118c are passed between the safety sensors module 120 and the electromagnetic energy receiver 200 via an optional second (secondary) fiber-based conduit 104b. The fiber-based conduits 104 may have the same or different properties. The fiber-based conduits 104 may include one or more fiber-optic cables or fiber-optic cable strands. The fiber-based conduits 104 may be arranged in a single jacket or separate jackets. The fiber-based conduits 104 may include any one or more other conduits (e.g., cables, wires, sheaths, or the like) to provide mechanical strength, stability, bias, or other properties. The fiber-based conduits 104 may include one or more sensors that consume or provide one or more of the control and data signals between the safety sensors module and the electromagnetic energy receiver 118c.

Optionally, the energy conversion component 202 includes a particularly formed opto-mechanical coupling 202a that receives the first (primary) fiber-based conduit 104a. Separately or cooperatively, the energy conversion component 202 and the opto-mechanical coupling 202a receive and direct the laser light 122b toward one or more energy conversion sub-components of the energy conversion component 202.

In some cases, the energy conversion sub-components of the energy conversion component 202 includes one or more photovoltaic (PV) cells. In some of these embodiments, the primary fiber-based conduit 104a (e.g., an optical fiber) coupled to the receiver 200 emits light generated by and passed from the electromagnetic energy transmitter 200. The light emitted from the primary fiber-based conduit 104a is spread radially from an optical element, which may sometimes be referred to as an optical "spike," onto the PV cells of the energy conversion component 202.

Figure 2A:
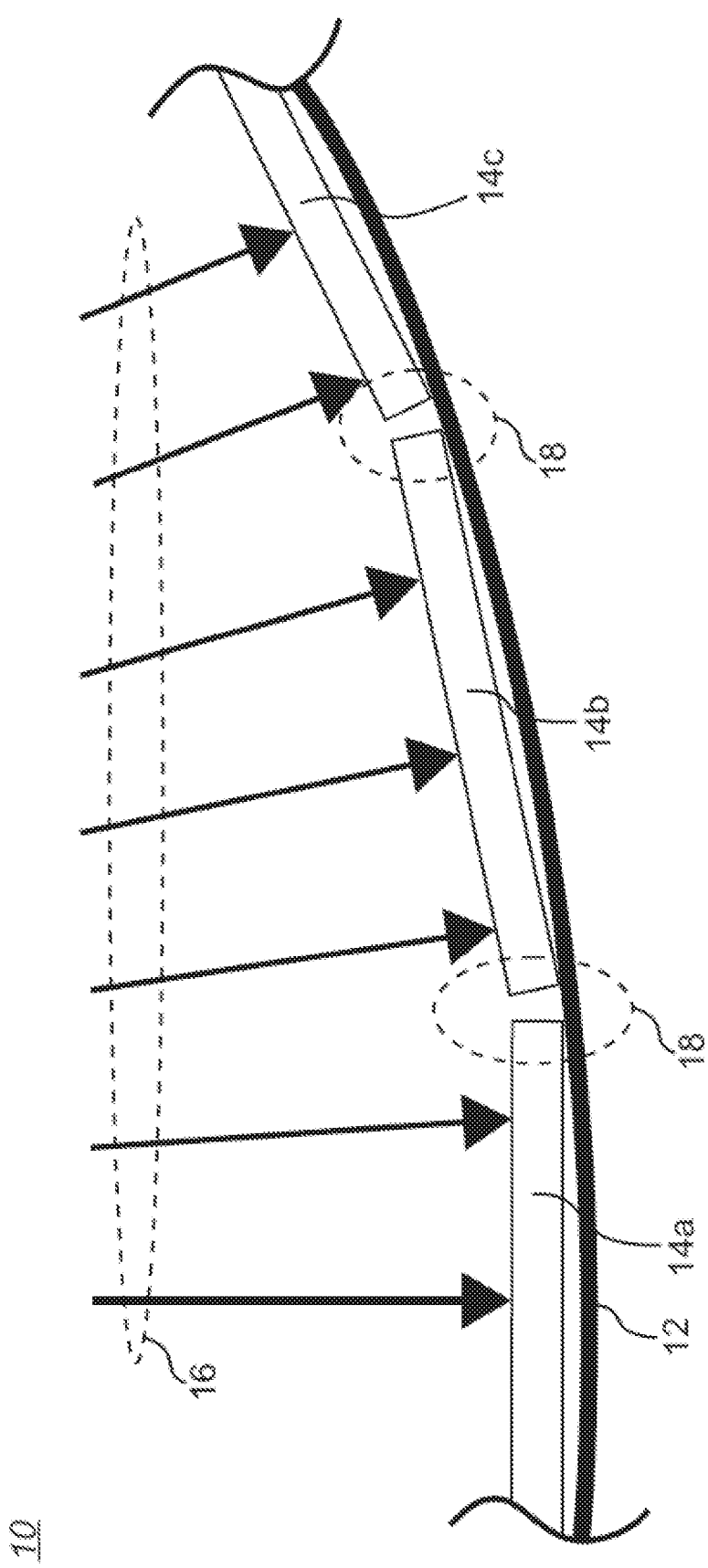
FIG. 2A is a conventional arrangement of PV cells on a non-planar surface.
Figure 2B:
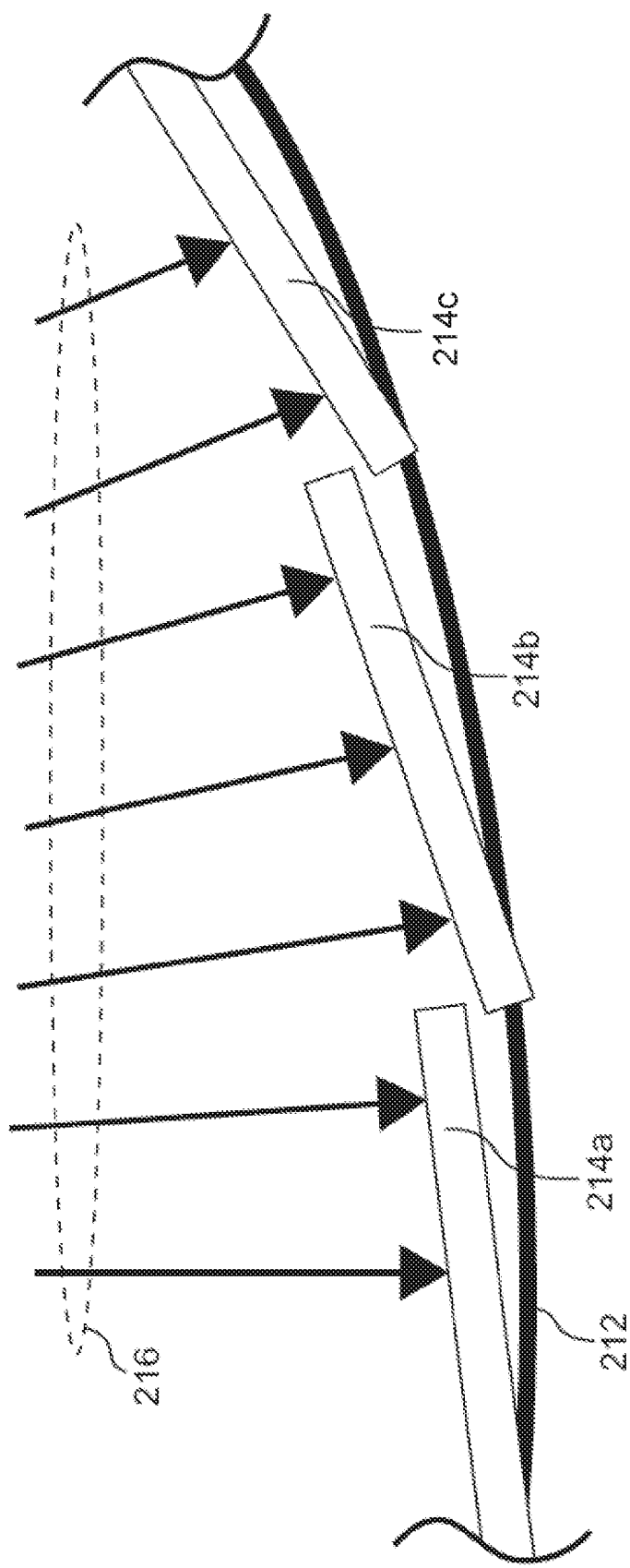
FIG. 2B is an improved arrangement of PV cells shingled on a non-planar surface.

FIG. 2 includes FIGS. 2A and 2B. FIG. 2A is a conventional arrangement 10 of PV cells on a non-planar surface, and FIG. 2B is an improved arrangement 208 of PV cells shingled on a non-planar surface of an energy conversion component 202 (FIG. 1) in a power-over-fiber (PoF) receiving device. Either of the arrangements 10, 208 may be formed in the energy conversion component 202 of FIG. 1, but the improved arrangement 208 increases the efficiency of the energy conversion component 202.

In the conventional arrangement 10 of PV cells on a non-planar surface 12 in FIG. 2, any number of PV cells 14a-14c may be arranged on the non-planar surface 12. In the illustration, three PV cells 14a, 14b, 14c are shown to simplify the drawing. As light 16 is spread radially from an optical element, it is shown that some of the light 16 strikes the PV cells 14a-14c, and some of the light may strike in the area between PV cells 18. In the conventional arrangement 10 of FIG. 2A, for example, PV cells 14a and 14b are arranged with one half millimeter (0.5 mm) spacing 18 therebetween, and PV cells 14b and 14c are similarly arranged. If each of PV cells 14a-14c are one centimeter (1 cm) wide, then about five percent (~5%) (e.g., 0.5 mm/1 cm=0.05) of power production capacity is not realized because light strikes in the area where there is no PV material.

In contrast to the conventional arrangement 10 of PV cells on a non-planar surface 12 in FIG. 2A, an improved arrangement 208 of PV cells shingled on a non-planar surface 212 is shown in FIG. 2B. In such an improved arrangement, subject to the size limitations of the structures themselves, any desirable number of PV cells may be arranged on the non-planar surface 212. FIG. 2B is simplified to show only three PV cells 214a-214c; however, it is recognized that additional PV cells, along the lines of PV cells 214a-214c, may be included to form an arc of any size or a full circle about a central axis (e.g., the central axis of a PoF receiver). As light 216 is spread radially from an optical element, it is shown that all of the available light 216 strikes the PV cells 214, and there is an absence of any gap (e.g., area, space, void, cavity, or the like) between PV cells. In this way, the improved arrangement 208 reduces or eliminates the apparent spacing between PV cells arranged around an optical spike or some other optical element with designs that tilt and shift each cell's support area (i.e., mounting surface) relative to the traditional flat method. As shown in FIG. 2B, at least one edge of one PV cell 214b is in front of, or collinear with, the nearer edge of the next cell 214c from the perspective of the radially streaming light 216.

In some cases, a PV cell does not include PV material "edge-to-edge," In these arrangements, a PV cell may be formed having one linear side of each PV cell used for a housing, bezel, or some other non-PV structure that contains or otherwise secures the PV material. In such a PV cell, the non-PV portion of the cell may be the portion of the cell that is "hidden" by a shingled adjacent cell.

Figure 3:
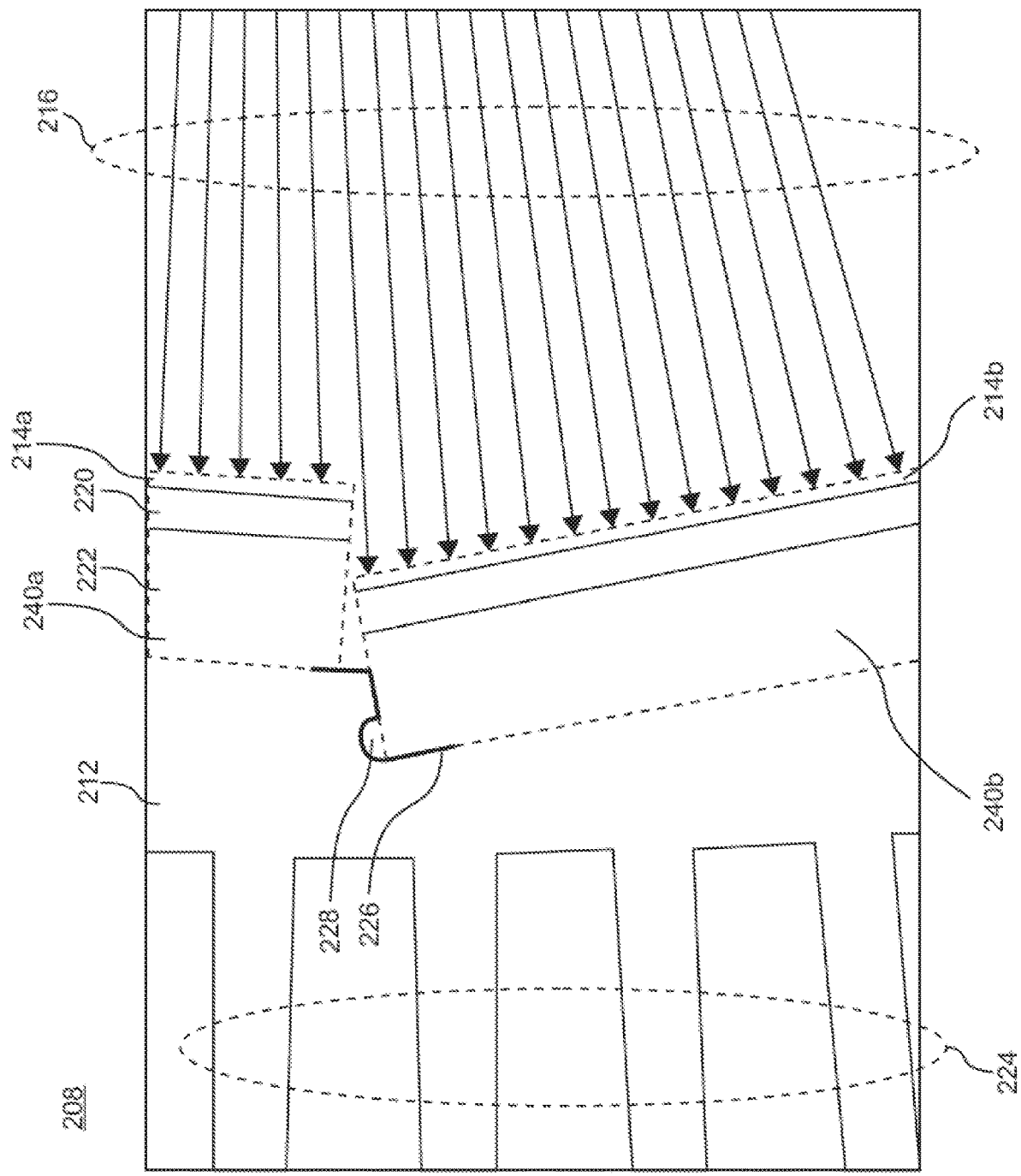
FIG. 3 is a magnified embodiment of the improved arrangement of PV cells shingled on a non-planar surface.

FIG. 3 is a magnified embodiment of the improved arrangement 208 of PV cells shingled on a non-planar surface 212. In the embodiment, a first PV cell 214a is mounted on a direct bond copper (DBC) substrate 220. The DBC substrate 220 is integrated with an aluminum nitride (AlN) material 222 to form a copper-on-AlN heat sink mounted in the curved enclosure that is arranged as the non-planar surface 212. Collectively, the first PV cell 214a, the DBC substrate 220, and the AlN material 222 may be referred to as the first PV cell assembly 240a. Along these lines, a second PV cell assembly 240b is also shown in the magnified embodiment of the improved arrangement 208.

The improved arrangement 208 may optionally include fins 224, or some other heat dissipation structure, to conduct heat away from the PV material. The fins 224 may be integrated with the heat sink, the curved enclosure, or some other structures. The fins 224 may be formed of aluminum or any other material that offers structural support with acceptable thermal conductivity. As shown in the improved arrangement 208 of FIG. 3, laser light 216 is radiated from the right towards the PV surfaces 214a, 214b.

The improved arrangement 208 of FIG. 3 includes a plurality of mounting/assembly features. Any number of same or different mounting/assembly features may be included in the improved arrangement 208. A first mounting/assembly feature 226 is emphasized in FIG. 3 to help explain the embodiment. The first mounting/assembly feature 226 in FIG. 3 is a shaped formation in the non-planar surface 212. The shaped formation is structurally configured to receive the second PV cell assembly 240b. Cooperatively, a second mounting/assembly feature 228 is arranged as a gap or space between the second PV cell assembly 240b and the non-planar surface 212 structure. The second mounting/assembly feature 228 may be arranged as a conduit for electrical connections of PV cells, as a trench for adhesive, as a strain relief feature, or for any other reason. In some cases, the second mounting/assembly feature 228 is a byproduct of manufacture. For example, in embodiments where the planar surface that receives the second PV cell assembly 240b is formed, the blade that forms the planar surface may be permitted to overshoot the boundary of second PV cell assembly 240b that is perpendicular to the planar surface.

The improved arrangement 208 of FIG. 3 arranges planar PV cell assemblies on non-planar surfaces. Beneficially, however, due to the cooperative alignment of PV cell assemblies, there is a reduction in optical losses that are otherwise present in assemblies that have gaps between PV cells. While PV cells formed of flexible material may also be used, such flexible material PV cells have other undesirable limitations. For example, flexible PV cells have issues that may lower electrical efficiency, and such flexible cells may also form bubbles at the interface with thermal adhesive. Other limitations are also contemplated. Nevertheless, in some embodiments, individual cells may be formed with flexible material to make the incident angle of light more uniform across each cell, and in these cases, the shingled arrangement of FIG. 3 may also be used to reduce or eliminate non-productive gaps between individual PV cells. In other embodiments, the arrangement of FIG. 3 is formed with rigid PV cells, which may increase overall efficiency of the receiving device, increase the range of acceptable operating temperature, and provide other benefits.

Figure 4:
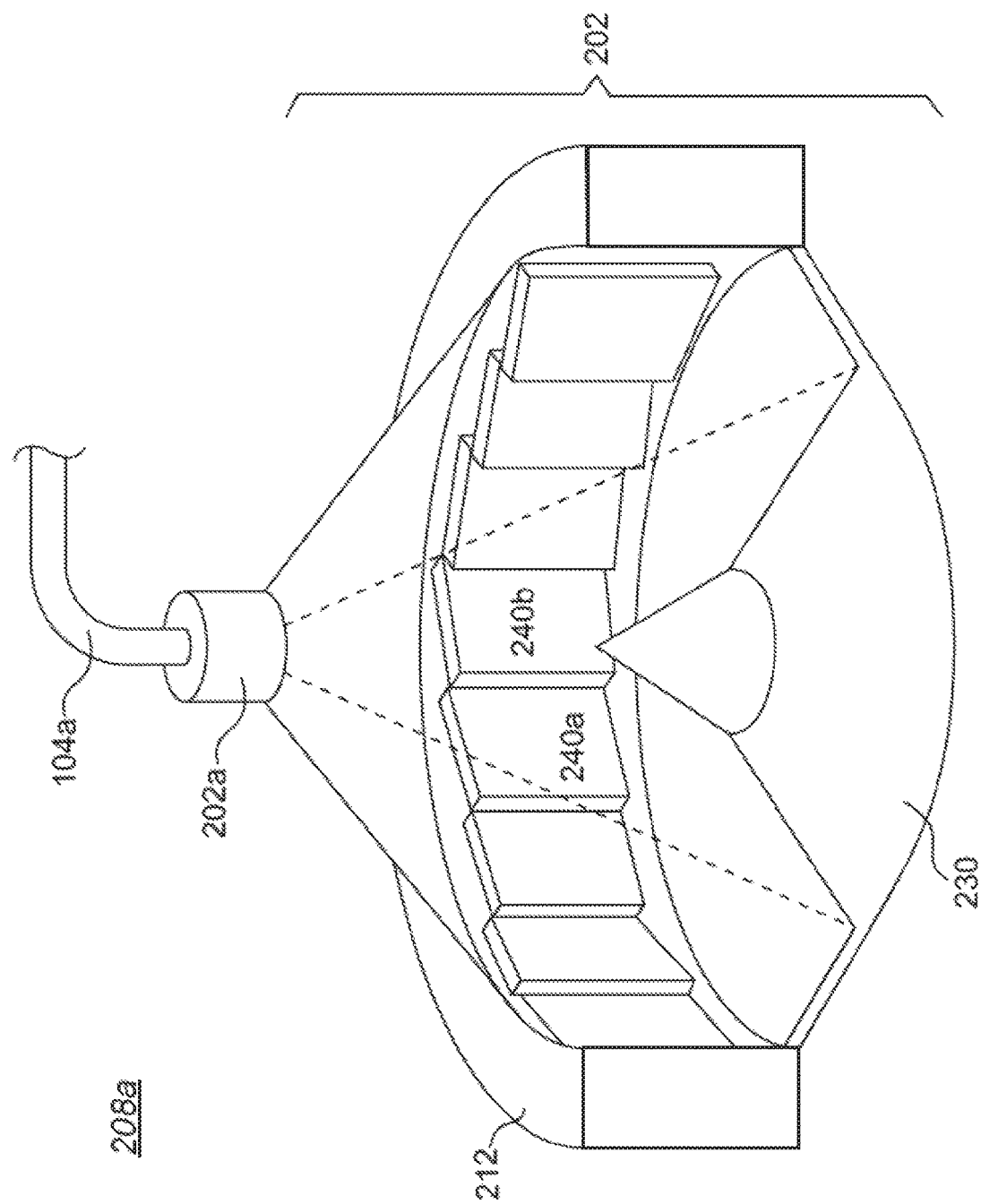
FIG. 4 is a second improved arrangement of PV cells shingled on a non-planar surface.

FIG. 4 is a second improved arrangement 208a of PV cells shingled on a non-planar surface 212. Borrowing from FIG. 1, the second improved arrangement 208a of FIG. 4 includes a cutaway (i.e., sectional) embodiment of an energy conversion component 202 and an opto-mechanical coupling 202a coupled to a first (primary) fiber-based conduit 104a. Laser light is passed through the primary fiber-based conduit 104a into the energy conversion component 202. The laser light is spread radially from an optical element 230, which may sometimes be referred to as an optical "spike," onto the PV cell assemblies of the energy conversion component 202. In FIG. 4, only two PV cell assemblies 240a, 240b are shown with reference identifiers; however, any desirable number of PV cell assemblies may be integrated therein.

The improved arrangement 208a of FIG. 4, which is represented by a sectional view, may be implemented in several embodiments. In at least one case, non-planar surface 212 has an arced profile of radius R on which the plurality of PV cells are shingly mounted (i.e., each one of the plurality of PV assemblies is shingled upon at least one adjacent PV assembly). In FIG. 4, radius R emanates from a central axis that passes through the center of the opto-mechanical coupling 202a and the "point" of the optical element 230 (e.g., optical spike). A first distance from an origin point of radius R on the central axis to a first edge of a first PV assembly is longer than a second distance from the origin point of radius R to a second edge of the first PV assembly, wherein a third distance between the first edge of the first PV assembly and the second edge of the PV assembly represents the width of photovoltaic material of the first PV cell assembly. In some embodiments represented in FIG. 4, a plurality of light-receiving elements (e.g., PV cells) are arranged in a substantially cylindrical shingled conformation about the central axis. In other embodiments, rather than forming the plurality of PV assemblies as a full circular perimeter around the central axis (i.e., substantially cylindrical), the plurality of PV assemblies forms only a partial circular perimeter (e.g., an arc of less than 360 degrees).

In one embodiment, the PV cell size might be approximately 1 cm×1.1 cm (e.g., less than two square centimeters). A DBC carrier may be 1 cm wide, 3 cm long, and 0.1 cm-0.2 cm thick. In this embodiment, a single circular "row" of 24 carrier-mounted cells would have an inner diameter of roughly 7.5 cm. The outer diameter may depend on the thermal management structure, but could be approximately 18 cm. The height of the overall energy conversion component 202 in this embodiment may further depend on the optical element 230 used for spreading the laser light, which could be in the range of 3-8 cm.

In the second improved arrangement 208a embodiment of FIG. 4, the amount of overlap between individual PV cell assemblies can be adjusted in the design based on restrictions such as a constraint on the energy conversion component 202 diameter, ease of assembly, and other system characteristics. In general, the amount of overlap between PV cell assemblies may be very small, and further arranged to increase the amount of light that is incident on PV material and not falling into any gaps.

In one embodiment, the energy conversion component 202 structure covers a full 360 degrees but is not actually a cylinder/circle. Instead, the energy conversion component 202 is an N-sided polygon with additional features, that provides flat surfaces for the PV cell assemblies and other features to aid in alignment, spacing, and other construction acts.

In some embodiments, the energy conversion component 202 is formed with as few as three (3) or four (4) PV cell assemblies. In these cases, the low number of PV cell assemblies can be laid flat in such a way that naturally provides zero-apparent-gap corners. Due, however, to the small number of PV cell assemblies, such embodiments may have only limited applicability.

In some embodiments, five (5) PV cell assemblies are arranged in a pentagon formation. This arrangement is favorable because the corners of each PV cell assembly meet in obtuse angles.

In still other embodiments, based on the dimensions of individual PV cell assemblies and the thickness of a DBC/ceramic carrier formed as the non-planar surface 212, various geometry-driven layout attempts suggest that at least 10 PV cell assemblies would beneficially provide a desired effect.

In cases where there would be concerns about the variation in incident light angle from a proximal edge of a PV cell assembly to its distal edge, a smaller total number of PV cell assemblies would arrange the assemblies to such an angle that they would be undesirably far from orthogonal to the incoming radiated light.

In many embodiments disclosed herein, any number of PV cell assemblies may be arranged in a suitable energy conversion component 202. In some cases, up to 100 or even more PV cell assemblies are arranged in an energy conversion component 202. Generally, the upper limit of the number of PV cell assemblies may be driven by optical requirements, a maximum size imposed by the application, a maximum size imposed by fabrication methods, or by other reasons. An energy conversion component 202 diameter of a few inches has been considered, and in such embodiment, about 20 to 40 PV cell assemblies of 1 cm width may be selected. Other different sizes are contemplated. Other quantities are also contemplated.

In one embodiment, the energy conversion component 202 can be assembled in the following manner. Each PV cell is first mounted on a separate DBC carrier to form a PV cell assembly. In other embodiments, PV cells might be mounted directly on the enclosure, without DBC carriers. A receiver support structure having the desired non-planar surface 212, including thermal management fins and other features, can be fabricated as a single piece by some combination of waterjet, laser cutting, CNC machining, EDM (Electrical Discharge Machining), or one or more other common techniques. The PV cell assemblies are then individually mounted with an adhesive thermal interface material that promotes heat transfer out of the PV material to the thermal management material. The electrical contacts of each PV cell assembly may then be connected to an electrical bus by soldering connecting wires to the PV cell assembly contacts, or by some other method.

A plurality of PV cell assemblies in the embodiments described herein may be wired together in any suitable combination of parallel and series connections as appropriate to the application.

FIG. 5 includes FIGS. 5A and 5B.

FIG. 5 shows front and side views of a PV cell assembly 240 embodiment. Other embodiments and arrangements are contemplated; however, the PV cell assembly 240 embodiment of FIG. 5 is shown for simplicity. In the PV cell assembly 240, a PV cell material 246 is disposed on a conductive PV bus material 248. A second conductor is arranged as a patterned conductive material 244, which is electrically isolated from the conductive PV bus material 248 by a patterned insulator 242.

In some of the embodiments disclosed herein, a plurality of assemblies formed in accordance with the PV cell assembly 240 of FIG. 5 are arranged as illustrated in portions of the energy conversion component 202 of FIGS. 1, 2B, 3, and 4. That is, a plurality of PV cell assemblies 240 are arranged in a shingled pattern. Cooperatively, in some embodiments, the shingled arrangements permit the PV bus 248 of one PV cell assembly 240 to electrically contact the patterned conductive material 244 of an adjacent PV cell assembly 240. In these and other embodiments, electrical contacts, lead frames, lead wires, or other structures having desirable electrical and mechanical properties are used.

In some embodiments described herein, an energy conversion component 202 is formed to be a full circle (i.e., a substantially cylindrical component having a circular cross-section). In other embodiments, the energy conversion component 202 is formed as a partial circle (i.e., an arc), a sphere, a partial sphere, a hemisphere, a partial hemisphere, or in some other shape. In these cases, the electromagnetic energy (e.g., laser light) will be shaped in a different manner by an appropriate electromagnetic shaping structure along the lines of how laser light is shaped by the optical element 230 of FIG. 4.

In the embodiments described herein, one material used in laser power photovoltaic (PV) conversion is gallium arsenide (GaAs), which is also sometimes used as one layer in triple junction solar cells. GaAs is limited to laser wavelengths below about 880 nm. Another material for longer wavelengths is indium gallium arsenide (InGaAs), with varying concentrations of indium depending on the peak wavelength desired. Another material that is sometimes used is gallium antimonide (GaSb). Silicon is also sometimes used for laser power conversion.

In the present disclosure, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with computing systems (e.g., electronics control module 116 and the power control module 204 of FIG. 1), including client and server computing systems, as well as networks have not been shown or described in detail to avoid unnecessarily obscuring descriptions of the embodiments.

The electronics control module 116 and the power control module 204 of FIG. 1 may be arranged as computing devices that include processors, memory, software, and other control mechanisms along these lines.

Processors, as described herein, include central processing units (CPU's), microprocessors, microcontrollers (MCU), digital signal processors (DSP), application specific integrated circuits (ASIC), state machines, and the like. Accordingly, a processor as described herein includes any device, system, or part thereof that controls at least one operation, and such a device may be implemented in hardware, firmware, or software, or some combination of at least two of the same. The functionality associated with any particular processor may be centralized or distributed, whether locally or remotely. A processor may interchangeably refer to any type of electronic control circuitry configured to execute programmed software instructions. The programmed instructions may be high-level software instructions, compiled software instructions, assembly-language software instructions, object code, binary code, micro-code, or the like. The programmed instructions may reside in internal or external memory or may be hard-coded as a state machine or set of control signals. According to methods and devices referenced herein, one or more embodiments describe software executable by the processor, which when executed, carries out one or more of the method acts.

As known by one skilled in the art, a computing device has one or more memories, and each memory may comprise any combination of volatile and non-volatile computer-readable media for reading and writing. Volatile computer-readable media includes, for example, random access memory (RAM). Non-volatile computer-readable media includes, for example, any one or more of read only memory (ROM), magnetic media such as a hard-disk, an optical disk drive, a flash memory device, a CD-ROM, and the like. In some cases, a particular memory is separated virtually or physically into separate areas, such as a first memory, a second memory, a third memory, etc. In these cases, it is understood that the different divisions of memory may be in different devices or embodied in a single memory.

In the present disclosure, memory may be used in one configuration or another. The memory may be configured to store data. In the alternative or in addition, the memory may be a non-transitory computer readable medium (CRM) wherein the CRM is configured to store instructions executable by a processor. The instructions may be stored individually or as groups of instructions in files. The files may include functions, services, libraries, and the like. The files may include one or more computer programs or may be part of a larger computer program. Alternatively or in addition, each file may include data or other computational support material useful to carry out the computing functions of the systems, methods, and apparatus described in the present disclosure.

In the foregoing description, certain specific details are set forth to provide a thorough understanding of various disclosed embodiments. However, one skilled in the relevant art will recognize that embodiments may be practiced without one or more of these specific details, or with other methods, components, materials, etc. In other instances, well-known structures associated with electronic and computing systems, including client and server computing systems, as well as networks, have not been shown or described in detail to avoid unnecessarily obscuring descriptions of the embodiments.

Unless the context requires otherwise, throughout the specification and claims which follow, the word "comprise" and variations thereof, such as "comprises" and "comprising," are to be construed in an open, inclusive sense, e.g., "including, but not limited to."

Reference throughout this specification to "one embodiment" or "an embodiment" and variations thereof means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content and context clearly dictates otherwise. It should also be noted that the conjunctive terms, "and" and "or" are generally employed in the broadest sense to include "and/or" unless the content and context clearly dictates inclusivity or exclusivity as the case may be. In addition, the composition of "and" and "or" when recited herein as "and/or" is intended to encompass an embodiment that includes all of the associated items or ideas and one or more other alternative embodiments that include fewer than all of the associated items or ideas.

The headings and Abstract of the Disclosure provided herein are for convenience only and do not limit or interpret the scope or meaning of the embodiments.

The various embodiments described above can be combined to provide further embodiments. Aspects of the embodiments can be modified, if necessary to employ concepts of the various patents, application and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electromagnetic energy receiving device, comprising:
    an energy conversion component; and
    an opto-mechanical coupling arranged to receive a fiber-based conduit, wherein the energy conversion component includes at least one internal surface having an arced profile of radius R, the internal surface having a plurality of photovoltaic (PV) assemblies arranged thereon such that each one of the plurality of PV assemblies is shingled upon at least one adjacent PV assembly.

2. An electromagnetic energy receiving device according to claim 1, wherein a first distance from an origin point of radius R to a first edge of a first PV assembly is longer than a second distance from the origin point of radius R to a second edge of the first PV assembly, wherein a third distance between the first edge of the first PV assembly and the second edge of the first PV assembly represents a width of photovoltaic material of the first PV assembly.

3. An electromagnetic energy receiving device according to claim 1, wherein the fiber-based conduit is arranged to pass laser light.

4. An electromagnetic energy receiving device according to claim 2, comprising:
    an optical element arranged to receive the laser light and radiate portions of the laser light toward the plurality of PV assemblies.

5. An electromagnetic energy receiving device according to claim 4, wherein shingling the plurality of PV assemblies exposes more photovoltaic material to the radiated laser light than if the plurality of PV assemblies were arranged edge-to-edge.

6. An electromagnetic energy receiving device according to claim 1, wherein the plurality of PV assemblies forms a full circular perimeter around a central axis about which the radius R is measured.

7. An electromagnetic energy receiving device according to claim 1, wherein the plurality of PV assemblies forms only a partial circular perimeter around a central axis about which the radius R is measured.

8. An electromagnetic energy receiving device according to claim 1, wherein an area of each one of the plurality of PV assemblies is less than two square centimeters.

9. An electromagnetic energy receiving device according to claim 1, wherein an area behind the plurality of PV assemblies is arranged to pass one or more electrical coupling conduits.

10. A power-over-fiber (PoF) receiver, comprising:
    a plurality of light-receiving elements arranged in a substantially cylindrical shingled conformation about a central axis, each of the plurality of light-receiving elements arranged to convert light to electricity.

11. A PoF receiver according to claim 10, comprising:
    an input port to receive light; and
    an optical element positioned along the central axis, the optical element arranged to expand the light outward toward the shingled conformation of light-receiving elements.

12. A PoF receiver according to claim 10, wherein the plurality of light-receiving elements includes more than 11 light-receiving elements.

13. A PoF receiver according to claim 12, wherein the plurality of light-receiving elements includes less than 128 light-receiving elements.

14. A PoF receiver according to claim 10, comprising:
    at least one heat-dissipating component thermally coupled to at least one of the plurality of light-receiving elements.

15. A PoF receiver according to claim 10, wherein various ones of the plurality of light-receiving elements are formed on a patterned direct bond copper (DBC) substrate and electrically coupled to an adjacent light-receiving element, respectively, via one or more patterns formed on the DBC substrate.

16. A method of forming an energy conversion component, comprising:
    providing a plurality of separate and distinct light-receiving elements, each of the plurality of light-receiving elements arranged to convert light to electricity;
    providing a receiver support structure having a non-planar surface; and
    shingly mounting each light-receiving element of the plurality of separate and distinct light-receiving elements such that each light-receiving element:
        is shingled upon at least one adjacent light-receiving element,
        has at least one adjacent light-receiving element shingled thereon, or
        both is shingled upon at least one adjacent light-receiving element and has at least one adjacent light-receiving element shingled thereon.

17. A method of forming an energy conversion component according to claim 16, comprising:
    applying of an adhesive thermal interface material during the mounting.

18. A method of forming an energy conversion component according to claim 16, wherein each of the plurality of light-receiving elements is mounted on a separate direct bond copper (DBC) substrate.

19. A method of forming an energy conversion component according to claim 16, wherein shingly mounting each light-receiving element includes mounting the light-receiving elements in a full circular pattern about a central axis.

20. A method of forming an energy conversion component according to claim 16, comprising:
    electrically coupling each light-receiving element to an electrical bus.

* * * * *